US009680391B2

(12) United States Patent
Venerus et al.

(10) Patent No.: US 9,680,391 B2
(45) Date of Patent: Jun. 13, 2017

(54) MULTI-INPUT SCALABLE RECTIFIER DROOP DETECTOR

(71) Applicant: QUALCOMM Incorporated, San Diego, CA (US)

(72) Inventors: Christian Venerus, San Diego, CA (US); Ashok Swaminathan, Cardiff, CA (US)

(73) Assignee: QUALCOMM Incorporated, San Diego, CA (US)

(*) Notice: Subject to any disclaimer, the term of this patent is extended or adjusted under 35 U.S.C. 154(b) by 209 days.

(21) Appl. No.: 14/670,996

(22) Filed: Mar. 27, 2015

(65) Prior Publication Data

US 2016/0285385 A1    Sep. 29, 2016

(51) Int. Cl.
| | | |
|---|---|---|
| *H02M 7/217* | (2006.01) | |
| *G01R 19/00* | (2006.01) | |
| *G01R 19/165* | (2006.01) | |
| *G06F 1/26* | (2006.01) | |
| *H03K 19/003* | (2006.01) | |
| *H02M 1/00* | (2006.01) | |

(52) U.S. Cl.
CPC ........ *H02M 7/217* (2013.01); *G01R 19/0084* (2013.01); *G01R 19/165* (2013.01); *G01R 19/16547* (2013.01); *G06F 1/26* (2013.01); *H03K 19/00346* (2013.01); *H02M 2001/0025* (2013.01)

(58) Field of Classification Search
CPC ....... H02M 3/1584; H02M 2001/0025; H02M 2001/0009; H02M 2003/1566; H02M 3/156; H02M 3/157; H02M 7/217; H03K 19/00346; G01R 19/0084; G01R 19/0092; G01R 19/165; G01R 19/16547
See application file for complete search history.

(56) References Cited

U.S. PATENT DOCUMENTS

| | | | |
|---|---|---|---|
| 2004/0008011 A1 | 1/2004 | Wang et al. | |
| 2007/0013414 A1* | 1/2007 | Paillet .............. | H03K 19/00346 327/50 |
| 2007/0192636 A1 | 8/2007 | Gonzalez et al. | |
| 2007/0236188 A1* | 10/2007 | Gibson ............... | H02M 3/1563 323/225 |
| 2011/0291630 A1* | 12/2011 | Konstadinidis ....... | H02M 3/157 323/283 |

(Continued)

OTHER PUBLICATIONS

International Search Report and Written Opinion—PCT/US2016/024189—ISA/EPO—Jun. 28, 2016.

*Primary Examiner* — Adolf Berhane
*Assistant Examiner* — Henry Lee, III
(74) *Attorney, Agent, or Firm* — Procopio, Cory, Hargreaves & Savitch LLP

(57) ABSTRACT

A droop detector includes: a plurality of input nodes, each input node configured to receive a supply voltage; an output node; a plurality of detector modules, each detector module comprises: an input terminal coupled to each input node, an output terminal coupled to the output node; and an input tracking unit configured as a voltage follower to detect a droop in the supply voltage coupled to each input node and output an output voltage that follows the supply voltage on the output terminal when the droop is detected on the supply voltage; and a comparator coupled to the output node and configured to output a control signal when the droop is detected.

18 Claims, 7 Drawing Sheets

(56) References Cited

U.S. PATENT DOCUMENTS

2014/0021929 A1 1/2014 Lin et al.
2014/0049108 A1 2/2014 Hsu et al.
2014/0091631 A1 4/2014 Naden et al.
2014/0266119 A1 9/2014 Burton et al.
2014/0266468 A1 9/2014 Jones et al.
2015/0002197 A1 1/2015 Chatterjee et al.

* cited by examiner

MULTI-INPUT SCALABLE RECTIFIER DROOP DETECTOR

BACKGROUND

Field

This invention relates generally to droop detectors, and more specifically, to a droop detector configured as a multi-input, multi-stage scalable rectifier.

Background

Typically, integrated circuits receive power from an external power source. These integrated circuits include multiple cores, each of which may be powered by a different external power supply with respect to the others. The different cores may operate at different supply voltages.

During operation, an integrated circuit may undergo power supply droop. Droop may be defined as a transitory reduction in the supply voltage for a given core. Droops may be caused by one or more factors, such as the simultaneous switching of a number of circuits, temperature variations and so forth. Circuitry subject to a power supply droop may experience erroneous operation (e.g., timing failures). Failures resulting from power supply droop may be considered soft failures, since they are not always repeatable in the absence of the drop in the supply voltage. Determining the cause and characterizing such failures may be difficult. However, droops on supplies for cores of a central processing unit (CPU) can lead to computational errors if left uncorrected.

SUMMARY

The present disclosure provides for detecting droops using a multi-input, multi-stage scalable rectifier with a non-linear feedback loop to disable stages with no droop transitions to avoid gain degradation.

In one embodiment, a droop detector is disclosed. The droop detector includes: a plurality of input nodes, each input node configured to receive a supply voltage; an output node; a plurality of detector modules, each detector module comprises: an input terminal coupled to each input node, an output terminal coupled to the output node; and an input tracking unit configured as a voltage follower to detect a droop in the supply voltage coupled to each input node and output an output voltage that follows the supply voltage on the output terminal when the droop is detected on the supply voltage; and a comparator coupled to the output node and configured to output a control signal when the droop is detected.

In another embodiment, a circuit to detect droops in a plurality of supply voltages is disclosed. The circuit includes: an output node; a plurality of detector modules, each detector module having an input terminal and an output terminal, the input terminal of each detector module to receive a supply voltage of the plurality of supply voltages, output terminals of the plurality of detector modules are coupled together at the output node, wherein each detector module further includes an input tracking loop to detect the droop in the supply voltage; a filter coupled to the output node and configured to pass frequencies of a voltage at the output node within a predetermined range; and a comparator coupled to the filter and configured to output a control voltage when the droop is detected in the supply voltage.

In another embodiment, an apparatus for detecting droops in a plurality of supply voltages is disclosed. The apparatus includes: multiple means for detecting droop, each means for detecting droop receives a supply voltage of the plurality of supply voltages, each means for detecting droop includes an input tracking loop to detect the droop in the supply voltage; means for coupling outputs of the multiple means for detecting droop; and means for comparing coupled to the means for coupling to output a control voltage when the droop is detected in the supply voltage.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

As stated above, droops on supply voltages for cores of a CPU can lead to computational errors if left uncorrected. Although increasing the supply voltages may alleviate the problem, it increases power consumption. Threshold-based droop detection systems typically monitor only one supply because increasing the number of supplies and coupling the outputs together decreases the input-output gain that is inversely proportional to the number of connected supplies such that it is difficult to detect the droop. It should be noted there are supply voltage variations that are different from droops on supply voltages. However, these supply voltage variations are expected and should not be detected as droops. For example, an average current drawn by a core (or a central processing unit (CPU)) may increase substantially if the number of instructions to be processed is significantly increased. Once the significant increase in the number of instructions to be processed has occurred and the average current has accordingly been increased, the supply voltage is expected to be lower than its nominal value by an amount equal to the increase in the average current multiplied by the resistance of the power distribution network. Thus, the reduction in the supply voltage is expected and the core/CPU should be designed to work under such conditions. In contrast, a droop on the supply voltage occurs while the core/CPU transitions from processing a few instructions to processing a large quantity of instructions. Thus, a droop is a transitory (typically much larger) reduction in the supply voltage.

Embodiments as described herein provide for detecting droops using a multi-input, multi-stage scalable rectifier with a non-linear feedback to disable stages with no droop transitions to avoid gain degradation. After reading this description it will become apparent how to implement the disclosure in various implementations and applications. Although various implementations of the present disclosure will be described herein, it is understood that these implementations are presented by way of example only, and not limitation. As such, this detailed description of various implementations should not be construed to limit the scope or breadth of the present disclosure.

Figure 1A:
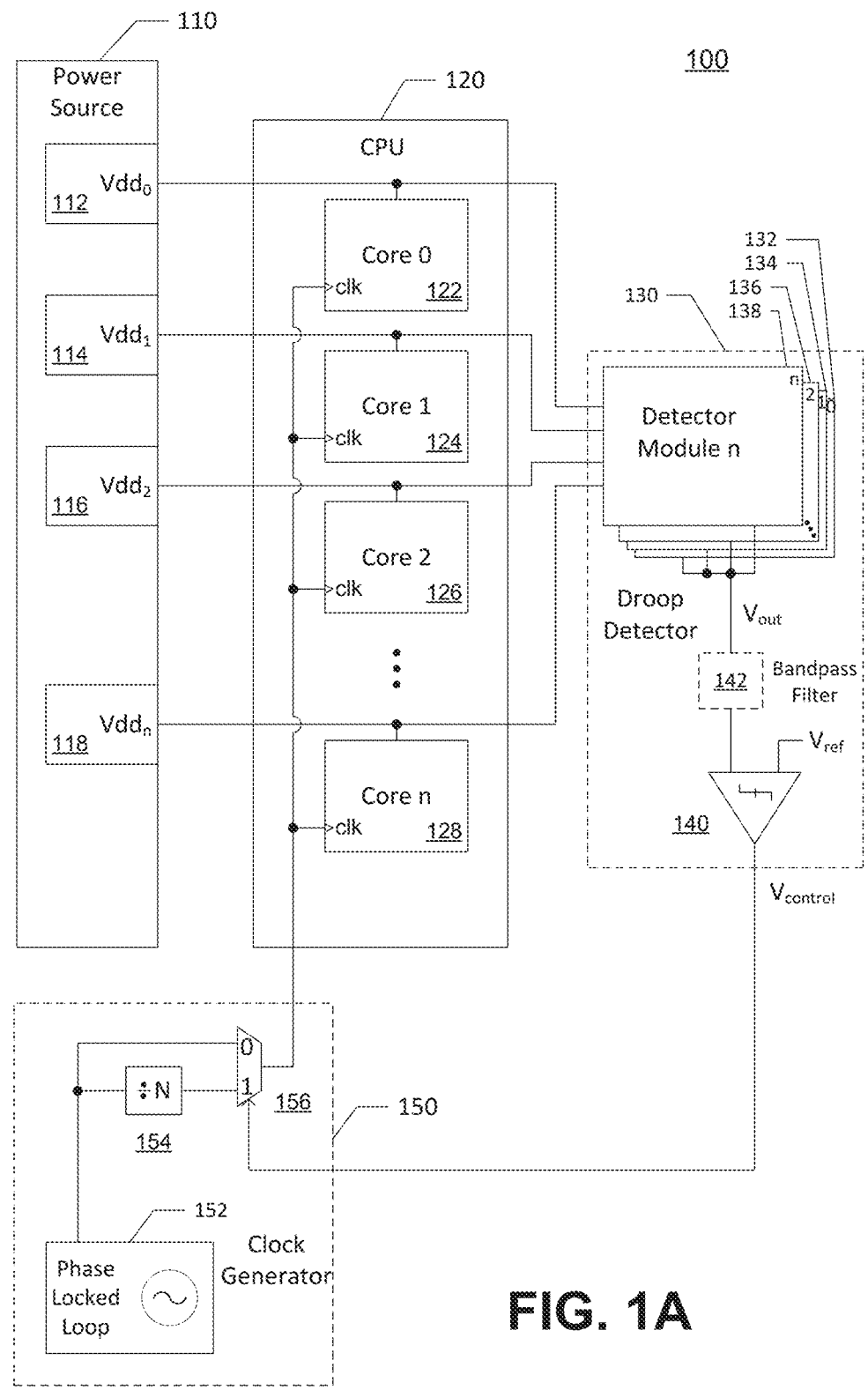
FIG. 1A is a functional block diagram of a system for detecting droops in the supply voltages and appropriately adjusting the clock frequency in accordance with one embodiment of the present disclosure.

FIG. 1A is a functional block diagram of a system 100 for detecting droops in the supply voltages and appropriately adjusting the clock frequency in accordance with one embodiment of the present disclosure. In the illustrated embodiment of FIG. 1A, the system 100 includes a power source 110, a central processing unit (CPU) 120, a droop detector 130, and a clock generator 150 in accordance with one embodiment of the present disclosure. The power source 110 includes a plurality of power supplies 112, 114, 116, 118 supplying voltages $Vdd_0$, $Vdd_1$, $Vdd_2$, $Vdd_n$, respectively. The CPU 120 includes a plurality of cores 122, 124, 126, 128 receiving voltages $Vdd_0$, $Vdd_1$, $Vdd_2$, $Vdd_n$, respectively. The droop detector 130 includes a plurality of detector modules 132, 134, 136, 138 also receiving $Vdd_0$, $Vdd_1$, $Vdd_2$, $Vdd_n$, respectively, and a comparator 140. That is, module 132 receives $Vdd_0$, module 134 receives $Vdd_1$, module 136 receives $Vdd_2$, and module 138 receives $Vdd_n$. Outputs of the detector modules 132, 134, 136, 138 are tied together to form a single output ($V_{out}$) for the droop detector 130.

The output of the detector modules 132, 134, 136, 138 ($V_{out}$) is coupled to one of the inputs of the comparator 140, which compares $V_{out}$ with a reference voltage ($V_{ref}$) and outputs a control signal ($V_{control}$) when $V_{out}$ falls below $V_{ref}$. In an alternative, the outputs of the detector modules 132, 134, 136, 138 ($V_{out}$) are coupled to the comparator 140 through a bandpass filter 142 to only pass frequencies of the output voltage within a predetermined range. The clock generator 150 includes a phase-locked loop (PLL) 152, a frequency divider unit 154, and a diplexer 156, which receives two inputs: (1) a direct output of the PLL; and (2) a divide-by-N output of the PLL. The divide-by-N output of the PLL has N-times the duration of the direct output of the PLL and its phase may be coherent with the phase of the direct output of the PLL. The output of the comparator 140 controls the diplexer 156 to select one of the two clock signals. When the comparator 140 outputs a signal in response to at least one droop detected by the droop detector 130, the output signal of the comparator 140 selects the divide-by-N output of the PLL at the diplexer 156 (selects "1" input). Otherwise, the output signal of the comparator 140 selects the direct output of the PLL at the diplexer 156 (selects "0" input). The output of the clock generator 150 is tied to the clock inputs of the plurality of cores 122, 124, 126, 128.

Figure 1B:
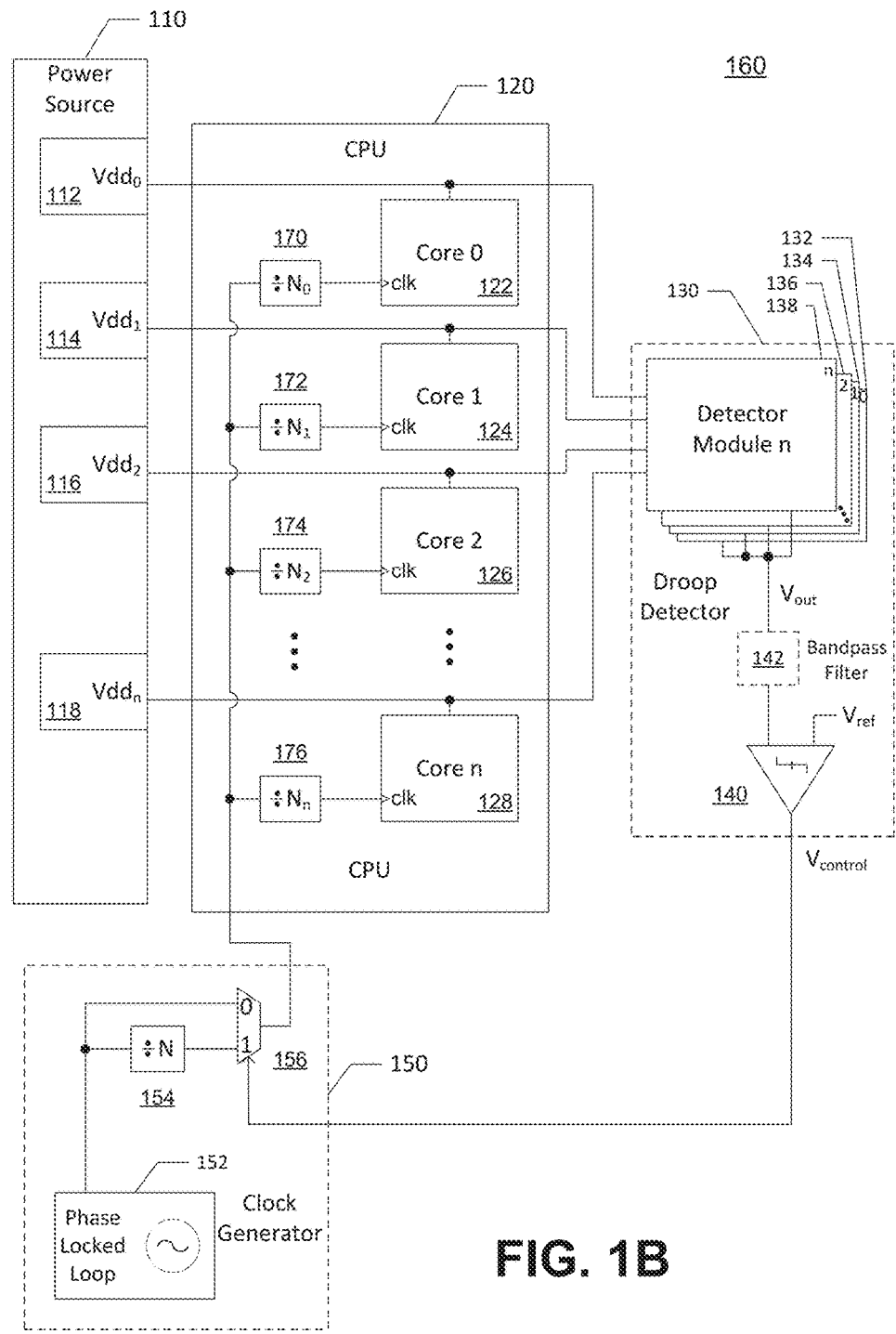
FIG. 1B is a functional block diagram of a system for detecting droops in the supply voltages and appropriately adjusting the clock frequency in accordance with another embodiment of the present disclosure.

FIG. 1B is a functional block diagram of a system 160 for detecting droops in the supply voltages and appropriately adjusting the clock frequency in accordance with another embodiment of the present disclosure. In the illustrated embodiment of FIG. 1B, the system 160 includes all of the modules that were included in the system 100 shown in FIG. 1A, but the system 160 further includes a dedicated frequency divider 170, 172, 174, or 176 for each core at its clock input. Thus, in the system 160, the operational frequency of each core can be configured to be a fraction of the global clock frequency. Further, a divider ratio (i.e., $N_0$, $N_1$, $N_2$, ... $N_n$) of the dedicated frequency divider 170, 172, 174, or 176 for each core can be same or different depending on the desired interface among cores.

Figure 2A:
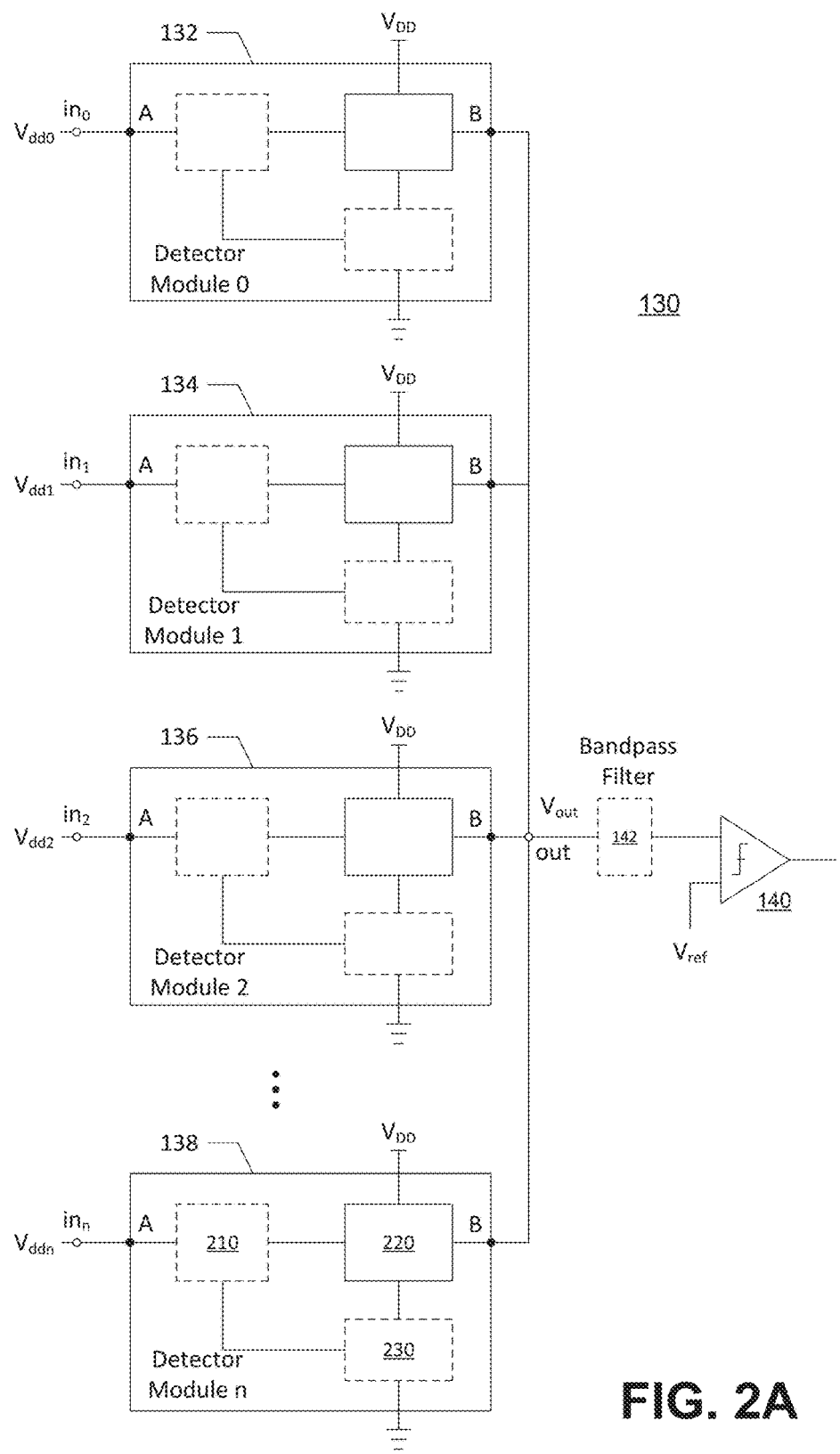
FIG. 2A is a functional block diagram of the droop detector including a plurality of detector modules in accordance with one embodiment of the present disclosure.

FIG. 2A is a functional block diagram of the droop detector 130 including detector modules 132, 134, 136, 138 in accordance with one embodiment of the present disclosure. In the illustrated embodiment of FIG. 2A, the droop detector 130 includes a plurality of input nodes ($in_0$, $in_1$, $in_2$, ..., $in_n$), an output node (out), and a plurality of detector modules 132, 134, 136, 138. Each input node is configured to receive a supply voltage ($V_{dd0}$, $V_{dd1}$, $V_{dd2}$, ..., or $V_{ddn}$). The output node (out) is configured to output an output voltage ($V_{out}$). Each detector module 132, 134, 136, or 138 includes an input terminal (A) coupled to each input node ($in_0$, $in_1$, $in_2$, ..., or $in_n$), an output terminal (B) coupled to the output node (out), and an input tracking unit 220 coupled to the input terminal (A) and the output terminal (B). In one embodiment, the input tracking unit 220 is configured to: (a) follow variations of the supply voltage at the input node onto the output terminal (a voltage follower) when droop is detected on the supply voltage; or (b) temporarily disconnect the output terminal from the output node when no droop is detected on the supply voltage.

In FIG. 2A, each detector module 132, 134, 136, or 138 further includes an alternating current coupling module 210 disposed between the input terminal (A) and the input tracking unit 220, and is configured to form a high pass filter including a capacitor and a resistor. Each detector module 132, 134, 136, or 138 further includes an offset cancelling module 230 configured to substantially reduce mismatch-induced droop-detection range differences among the plurality of detector modules when the output terminals are coupled together at the output node. The offset cancelling module 230 is coupled to the input tracking unit 220 and the alternating current (AC) coupling module 210. The droop detector 130 further includes a comparator 140 configured to receive and compare the output voltage ($V_{out}$) to a reference voltage ($V_{ref}$). As stated above, the outputs of the detector modules 132, 134, 136, 138 ($V_{out}$) can be coupled to the comparator 140 through a bandpass filter 142 to only pass frequencies of the output voltage within a predetermined range.

Figure 2B:
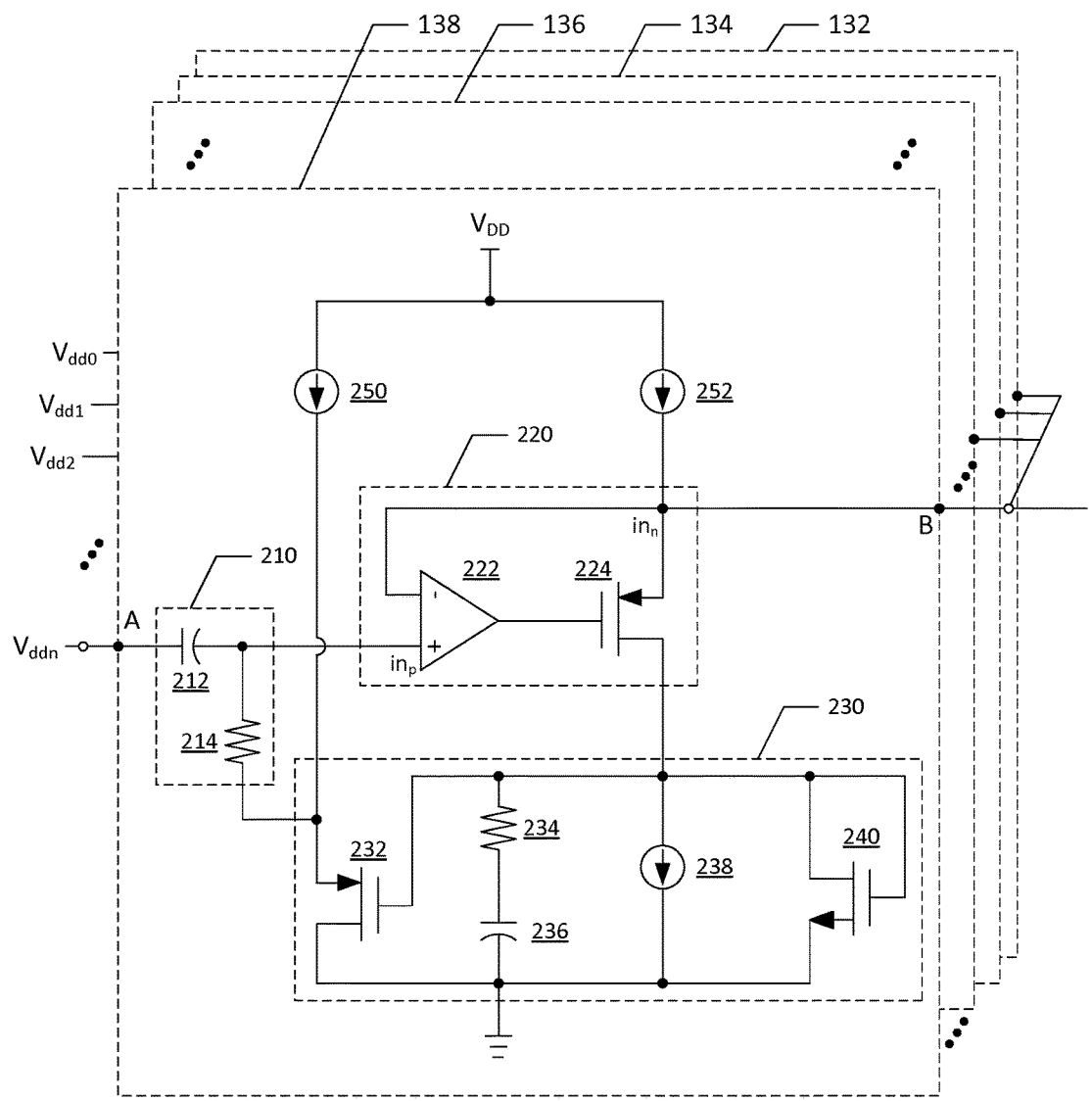
FIG. 2B is a schematic diagram of the plurality of detector modules of the droop detector in accordance with one embodiment of the present disclosure.

FIG. 2B is a schematic diagram of the detector modules 132, 134, 136, 138 of the droop detector 130 in accordance with one embodiment of the present disclosure. The illustrated embodiment of FIG. 2B shows only the schematic diagram of the detector module 138 receiving supply voltage $Vdd_n$ because it is at the top of the cascade of detector modules. However, it should be noted that each of the other detector modules 132, 134, 136 includes same elements with a same schematic diagram as that of the detector module 138. The only difference is the input supply voltage. Detector module 132 receives supply voltage $Vdd_0$, detector module 134 receives supply voltage $Vdd_1$, and detector module 136 receives supply voltage $Vdd_2$. As stated above, outputs of the detector modules 132, 134, 136, 138 are tied together to form a single output ($V_{out}$).

FIG. 2B shows the detector module 138 including an AC coupling module 210, an input tracking unit 220, and an offset cancelling module 230. The AC coupling module 210 includes a capacitor 212 and a resistor 214 forming a high pass filter to track only input variations above a desired frequency, which can be adjusted by varying the values of the capacitor 212 and the resistor 214. The AC coupling module 210 also avoids providing a DC load to the power source driving the droop detector 130. The input tracking unit 220 includes an operational amplifier (op amp) 222 and a p-type metal-oxide semiconductor field-effect transistor (p-MOSFET or PMOS transistor) 224 forming a voltage follower. The PMOS transistor 224 includes a gate terminal, a source terminal, and a drain terminal. The op amp 222 includes an output pin coupled to the gate terminal of the PMOS transistor, a negative input pin coupled to the source terminal, and a positive input pin coupled to the input terminal of each detector module through a capacitor of the AC coupling module. Thus, the negative input terminal ($in_n$) of the op amp 222 follows the positive input terminal ($in_p$) of the op amp 222. The use of the PMOS transistor 224 enables the input tracking unit 220 to track and detect negative-going voltages at $in_p$. In another embodiment, an n-type metal-oxide semiconductor field-effect transistor (n-MOSFET or NMOS transistor) can be used to enable the input tracking unit 220 to track and detect positive-going voltages at $in_p$. The offset cancelling module 230 includes PMOS transistor 232, a resistor 234, a capacitor 236, a current source 238, and an NMOS transistor 240 referred to as a voltage clamp. In one embodiment, the offset cancelling module 230 is configured to substantially reduce mismatch-induced droop-detection range differences among the detector modules 132, 134, 136, 138 when the outputs of those units are tied together. Current sources 250, 252 provide an appropriate amount of current for proper operation of the detector module 130. The current source 252 is coupled to a voltage source ($V_{DD}$) and the source terminal of the PMOS transistor 224. The current source 250 is coupled to the voltage source and the PMOS transistor 232.

Figure 3A:
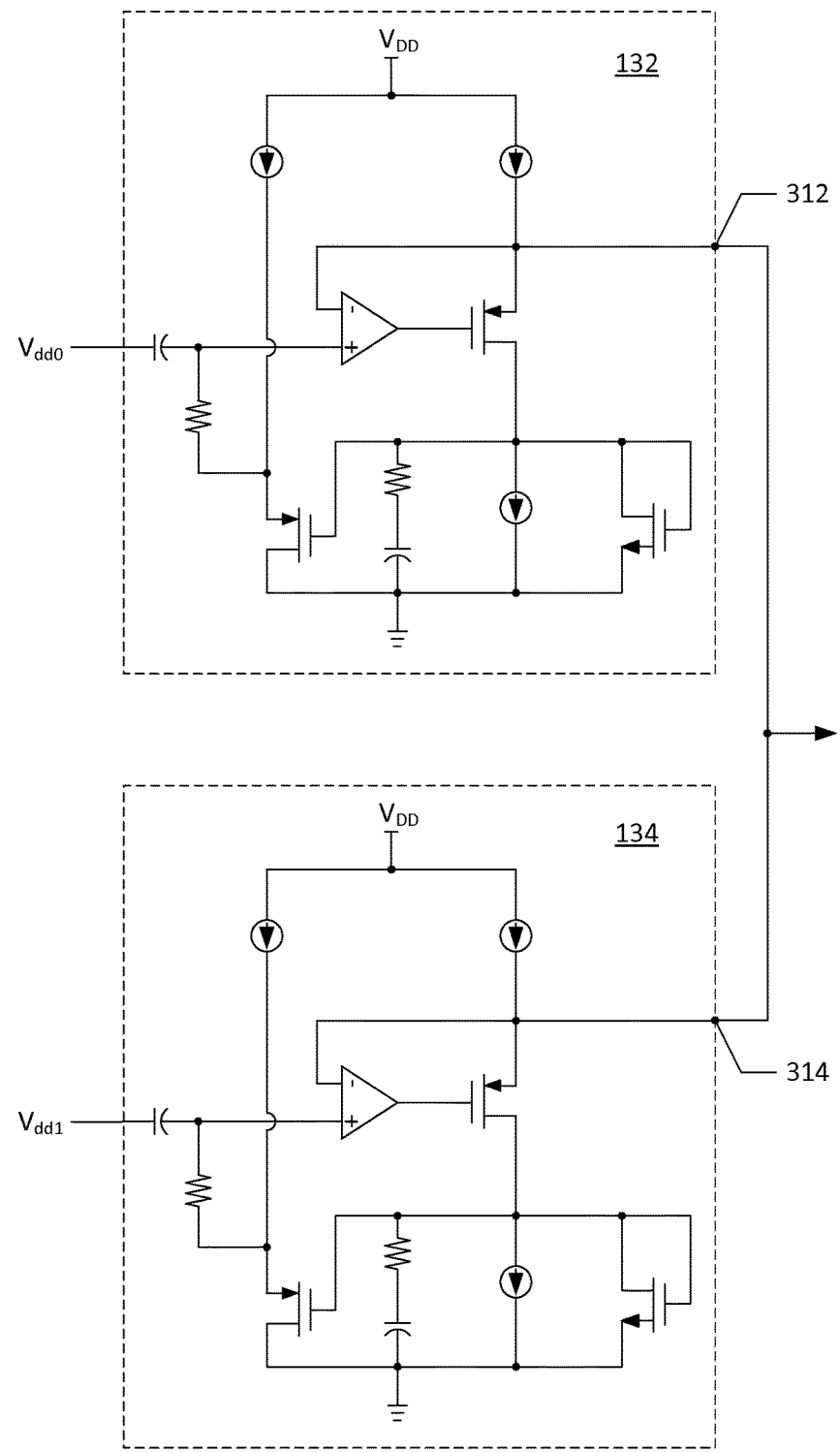
FIG. 3A shows a connection of the outputs of the two detector modules in the droop detector in accordance with one embodiment of the present disclosure.

FIG. 3A shows a connection of the outputs of the two detector modules 132, 134 in the droop detector 130 in accordance with one embodiment of the present disclosure. In the illustrated embodiment of FIG. 3A, the detector module 132 receives supply voltage $Vdd_0$, while the detector module 134 receives supply voltage $Vdd_1$. Further, the output terminal 312 of the detector module 132 is connected to the output terminal 314 of the detector module 134.

Figure 3B:
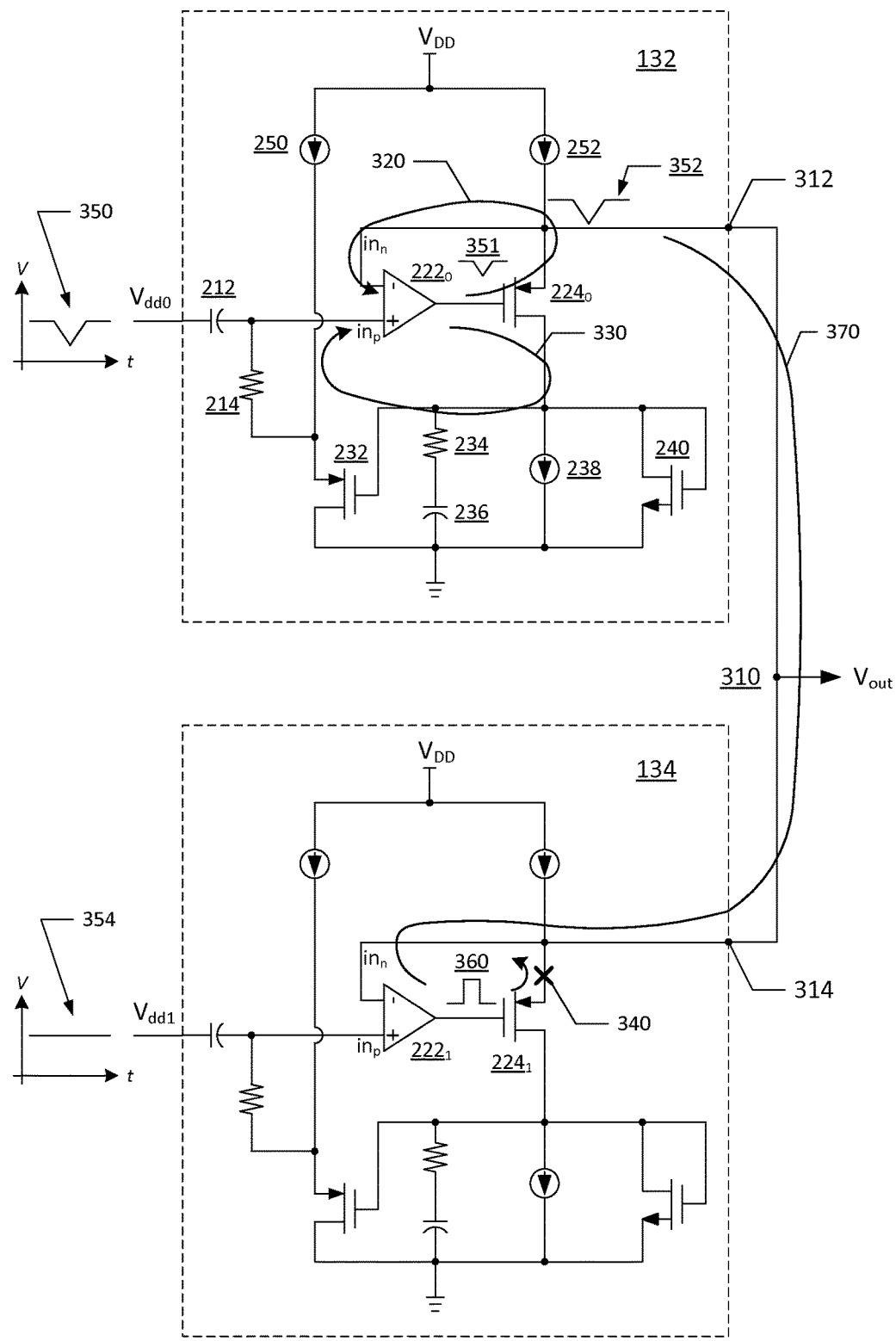
FIG. 3B shows the operation of the two detector modules connected together at an output node in accordance with one example embodiment of the present disclosure.

FIG. 3B shows the operation of the two detector modules 132, 134 connected together at an output node 310 in accordance with one example embodiment of the present disclosure. In the illustrated embodiment of FIG. 3B, the detector module 132 receives supply voltage $Vdd_0$, which includes droop 350 from a nominal voltage, while the detector module 134 receives supply voltage $Vdd_1$, with no droop 354 in the voltage.

The positive input terminal ($in_p$) of the op amp $222_0$ in the detector module 132 tracks the droop 350, which is reflected at the output of op amp $222_0$ as a negative spike 351, and at the negative input terminal ($in_n$) of the op amp $222_0$ and the output terminal 312 of the detector module 132 as a negative voltage spike 352. The negative voltage spike 351 causes the PMOS transistor $224_0$ to conduct so that the output terminal 312 of the detector module 132 indicates that there is droop in the supply voltage $Vdd_0$. This process is included in an input tracking loop 320. Meanwhile, the positive input terminal ($in_p$) of the op amp $222_1$ in the detector module 134 retains its biasing voltage as there is no droop (e.g., input 354) in the supply voltage $Vdd_1$. Although the negative input terminal ($in_n$) of the detector module 134 should follow the positive input terminal ($in_p$), the result is different. Since the negative input terminal ($in_n$) of the op amp $222_1$ in the detector module 134 is connected to the negative input terminal ($in_n$) of the op amp $222_0$ in the detector module 132 (because the output terminal 312 is connected to the output terminal 314 through the output node 310), the negative spike 352 at the negative input terminal ($in_n$) of the op amp $222_0$ in the detector module 132 causes op amp $222_1$ in the detector module 134 to output a positive-going pulse 360, which turns the PMOS transistor $224_1$ off. This process is included in a non-linear feedback loop 370. This also provides an added benefit for the droop detector 130 in that the non-linear feedback loop 370 of each detector module is configured to temporarily disable detector modules that are detecting no droop (e.g., input 354) at their respective inputs while other detector modules are detecting a droop at their respective inputs (e.g., input 350). Thus, by turning the PMOS transistor $224_1$ off and temporarily disconnecting (see disconnection 340) the source terminal of transistor $224_1$ from the output terminal 314 of the detector module 134 when no droop is detected, the droop detector 130 prevents the detector modules with no droop detection from degrading the gain of the output ($V_{out}$). The configuration of the droop detector 130 also includes an offset cancelling loop 330 which operates to substantially reduce mismatch-induced droop-detection range differences among detector modules 132, 134, 136, 138 when their outputs are tied together.

Figure 4:
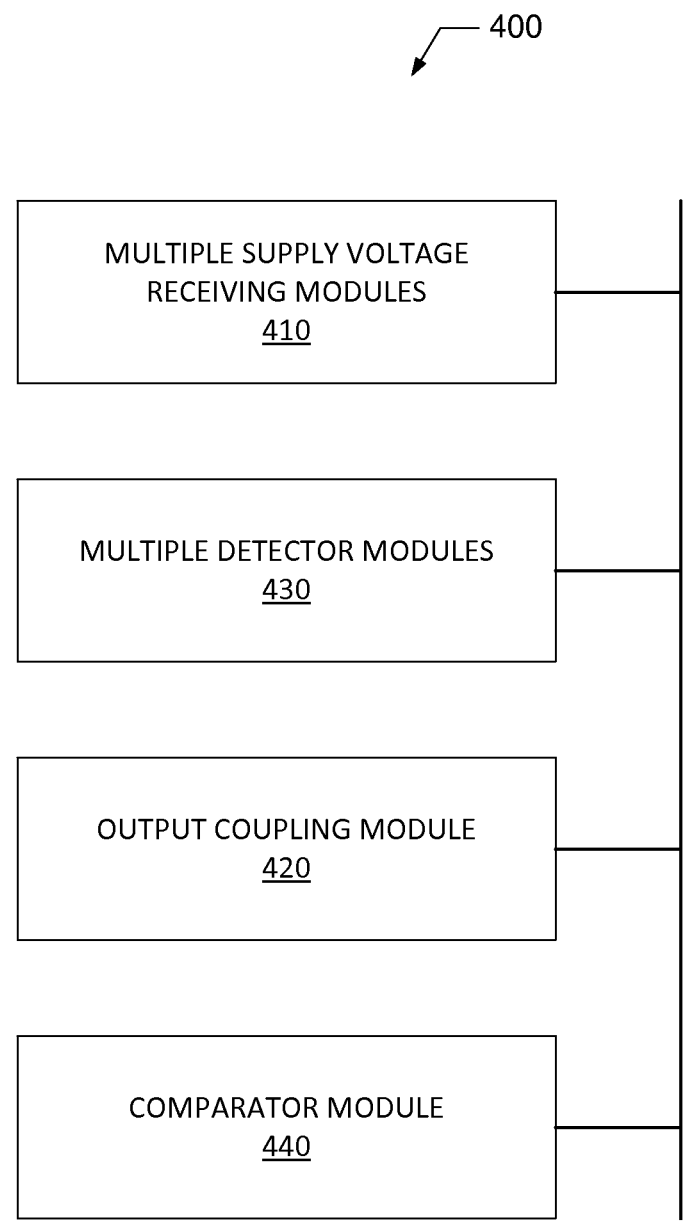
FIG. 4 is a functional block diagram of an apparatus configured to detect droops using a multi-input, multi-stage scalable detector with a non-linear feedback to disable stages with no droop transitions to avoid gain degradation in accordance with one embodiment of the present disclosure.

FIG. 4 is a functional block diagram of an apparatus 400 configured to detect droops using a multi-input, multi-stage scalable detector with a non-linear feedback to disable stages with no droop transitions to avoid gain degradation in accordance with one embodiment of the present disclosure. The apparatus 400 includes multiple supply voltage receiving units 410, an output coupling unit 420, and multiple detector modules 430. Each supply voltage receiving unit 410 is configured to receive a supply voltage ($V_{dd0}$, $Vdd_1$, $V_{dd2}$, . . . , or $V_{ddn}$). The output coupling unit 420 is configured to couple the outputs of the multiple detector modules 430 and output an output voltage ($V_{out}$) at an output terminal. Each detector module 430 is coupled to each supply voltage receiving unit 410. Each detector module 430 also includes an input tracking unit configured to: (a) follow variations of the supply voltage at each supply voltage receiving unit 410 onto the output terminal when droop is detected on the supply voltage; or (b) temporarily disconnect the output terminal when no droop is detected on the supply voltage. Each detector module 430 further includes an alternating current (AC) coupling unit to form a high pass filter and an offset cancelling unit configured to substantially reduce mismatch-induced droop-detection range differences among the multiple detector modules 430 when the output terminals are coupled together. The apparatus 400 further includes a comparator unit 440 configured to receive and compare the output voltage ($V_{out}$) to a reference voltage ($V_{ref}$).

Although several embodiments of the disclosure are described above, many variations of the disclosure are possible. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A droop detector, comprising:
   a plurality of input nodes, each input node configured to receive a supply voltage;
   an output node;
   a plurality of detector modules, each detector module comprises: an input terminal coupled to each input node, an output terminal coupled to the output node; and an input tracking unit configured as a voltage follower to detect a droop in the supply voltage coupled to each input node and output an output voltage that follows the supply voltage on the output terminal when the droop is detected on the supply voltage,
   wherein each detector module is configured to provide a non-linear feedback to temporarily disconnect the output terminal of each detector module from the output node when each detector module is detecting no droop at its input while other detector modules of the plurality of detector modules are detecting at least one droop at other input nodes of the plurality of input nodes; and
   a comparator coupled to the output node and configured to output a control signal when the droop is detected.

2. The droop detector of claim 1, wherein each detector module further comprises an alternating current (AC) coupling module disposed between the input terminal and the input tracking unit.

3. The droop detector of claim 2, wherein the AC coupling module is configured to form a high pass filter including a capacitor and a resistor.

4. The droop detector of claim 3, wherein the input tracking unit comprises:
   a first p-type metal-oxide semiconductor (PMOS) transistor including a gate terminal, a source terminal, and a drain terminal; and
   an operational amplifier including an output pin coupled to the gate terminal of the first PMOS transistor, a negative input pin coupled to the source terminal of the first PMOS transistor, and a positive input pin coupled to the input terminal of each detector module through the capacitor of the AC coupling module.

5. The droop detector of claim 4, further comprising
   a first current source coupled to a voltage source and the source terminal of the first PMOS transistor.

6. The droop detector of claim 4, wherein each detector module further comprises an offset cancelling module coupled to the drain terminal of the first PMOS transistor and configured to reduce mismatch-induced droop-detection range differences among the plurality of detector modules.

7. The droop detector of claim 6, wherein the offset cancelling module comprises a voltage clamp including an n-type metal-oxide semiconductor (NMOS) transistor, a second PMOS transistor, a resistor, a capacitor, and a second current source.

8. The droop detector of claim 7, further comprising
   a third current source coupled to a voltage source and the second PMOS transistor.

9. The droop detector of claim 1, wherein the comparator is configured to compare the output voltage to a reference voltage to determine that the droop is detected in at least one supply voltage.

10. The droop detector of claim 1, further comprising
    a bandpass filter disposed between the output node and the comparator to only pass frequencies of the output voltage within a predetermined range.

11. A circuit to detect droop in a plurality of supply voltages, comprising:
    an output node;
    a plurality of detector modules, each detector module having an input terminal and an output terminal, the input terminal of each detector module to receive a supply voltage of the plurality of supply voltages, output terminals of the plurality of detector modules are coupled together at the output node,
    wherein each detector module further includes an input tracking loop to detect the droop in the supply voltage,
    wherein each detector module further includes an offset cancelling loop to substantially reduce mismatch-induced droop-detection range differences among the plurality of detector modules;
    a filter coupled to the output node and configured to pass frequencies of a voltage at the output node within a predetermined range; and
    a comparator coupled to the filter and configured to output a control voltage when the droop is detected in the supply voltage.

12. The circuit of claim 11, wherein each detector module includes a non-linear feedback to temporarily disconnect the output terminal of each detector module from the output node when each detector module is detecting no droop at its input while other detector modules of the plurality of detector modules are detecting at least one droop at other input nodes of the plurality of input nodes.

13. The circuit of claim 11, wherein each detector module further comprises an alternating current (AC) coupling module disposed between the input terminal and the input tracking loop.

14. The circuit of claim 13, wherein the AC coupling module includes a capacitor coupled to the input terminal and the input tracking loop, and a resistor coupled to the input tracking loop and the offset cancelling loop.

15. The circuit of claim 11, wherein the comparator is configured to compare the voltage at the output node to a reference voltage to determine that the droop is detected in at least one of the plurality of supply voltages.

16. An apparatus for detecting droops in a plurality of supply voltages, comprising:
multiple means for detecting droop, each means for detecting droop receives a supply voltage of the plurality of supply voltages from an input node of a plurality of input nodes, each means for detecting droop includes an input tracking loop to detect the droop in the supply voltage,
wherein each means for detecting droop includes means for substantially reducing mismatch-induced droop-detection range differences among the multiple means for detecting droop;
means for coupling outputs of the multiple means for detecting droop; and
means for comparing coupled to the means for coupling to output a control voltage when the droop is detected in the supply voltage.

17. The apparatus of claim 16, wherein each means for detecting droop includes means for disconnecting each means for detecting droop from the means for coupling when no droop is detected on the supply voltage, while other means for detecting droop detect at least one droop.

18. A droop detector, comprising:
a plurality of input nodes, each input node configured to receive a supply voltage;
an output node;
a plurality of detector modules, each detector module comprises: an input terminal coupled to each input node, an output terminal coupled to the output node; and an input tracking unit configured as a voltage follower to detect a droop in the supply voltage coupled to each input node and output an output voltage that follows the supply voltage on the output terminal when the droop is detected on the supply voltage,
wherein each detector module further comprises an alternating current (AC) coupling module disposed between the input terminal and the input tracking unit,
wherein the AC coupling module is configured to form a high pass filter including a capacitor and a resistor,
wherein the input tracking unit comprises: a first p-type metal-oxide semiconductor (PMOS) transistor including a gate terminal, a source terminal, and a drain terminal; and an operational amplifier including an output pin coupled to the gate terminal of the first PMOS transistor, a negative input pin coupled to the source terminal of the first PMOS transistor, and a positive input pin coupled to the input terminal of each detector module through the capacitor of the AC coupling module; and
a comparator coupled to the output node and configured to output a control signal when the droop is detected.

* * * * *